United States Patent [19]

Clark

[11] 4,009,483
[45] Feb. 22, 1977

[54] IMPLEMENTATION OF SURFACE SENSITIVE SEMICONDUCTOR DEVICES

[75] Inventor: Lowell E. Clark, Paradise Valley, Ariz.

[73] Assignee: Motorola, Inc., Chicago, Ill.

[22] Filed: Sept. 2, 1975

[21] Appl. No.: 609,886

Related U.S. Application Data

[63] Continuation of Ser. No. 457,949, April 4, 1974, abandoned, which is a continuation of Ser. No. 240,634, April 3, 1972, abandoned.

[52] U.S. Cl. .................... 357/52; 357/34; 357/35; 357/53
[51] Int. Cl.² .............. H01L 29/34; H01L 29/40; H01L 29/72
[58] Field of Search ............... 357/52, 53, 34, 35

[56] References Cited

UNITED STATES PATENTS

| | | | |
|---|---|---|---|
| 3,391,287 | 7/1968 | Kao et al. | 357/352 |
| 3,710,204 | 1/1973 | Batz | 357/53 |
| 3,763,406 | 10/1973 | Bosselaar | 357/53 |
| 3,911,473 | 10/1975 | Nienhuis | 357/53 |

FOREIGN PATENTS OR APPLICATIONS

| | | | |
|---|---|---|---|
| 2,031,082 | 4/1971 | Germany | 357/53 |
| 300,472 | 4/1968 | Sweden | 357/53 |

OTHER PUBLICATIONS

IBM Technical Disclosure Bulletin; by Kaplan, vol. 14, No. 1, June 1971, p. 172.

Surface Breakdown in Silicon Planar Diodes Equipped with Field Plate; Solid State Electronics, vol. 15, pp. 93–105, by Conti, Feb. 1972.

Primary Examiner—Andrew J. James

[57] ABSTRACT

A semiconductor structure is disclosed which reliably provides for very high PN junction reverse breakdown voltages. A very high resistivity film overlying a junction-protecting oxide passivation layer and making electrical contact with the P-type material and the N material of the subject PN junction is utilized to neutralize the effects of accumulated charge on or within the oxide passivation layer. Annular guard rings surrounding and spaced from the subject PN junction may be biased by contacting the high resistivity film, thereby improving the PN junction reverse breakdown voltage. The stability of the shunt leakage current through the high resistivity film is greatly increased by means of a thin, high integrity oxide layer grown or deposited thereon. In integrated circuit structures, parasitic FET paths due to inversion of semiconductor material caused by charge accumulations at the oxide surface are suppressed by judicious electroding, wherein the oxide surface potential over critical regions is set to desired values by judicious extensions of interconnnect metalization and very high resistivity films over the oxide surface, and in intimate contact therewith. The use of the very high resistivity film allows setting of oxide surface potentials over critical areas otherwise unaccessible because of metal interconnect layout limitations.

2 Claims, 4 Drawing Figures

IMPLEMENTATION OF SURFACE SENSITIVE SEMICONDUCTOR DEVICES

This application is a continuation of Ser. No. 457,949 filed Apr. 4, 1974, now abandoned; which was a continuation of Ser. No. 240,634, filed Apr. 3, 1972, also now abandoned.

BACKGROUND OF THE INVENTION

This invention relates to high voltage semiconductor devices such as diodes and transistors in which a diode PN junction or a transistor collector-base junction must withstand applied voltages in the range from several hundred volts to several thousand volts. This invention relates more particularly to practical means of preventing premature reverse junction breakdown voltage below the theoretical breakdown value. Such premature breakdown is caused by peaking of electric fields at the surface of the single crystal semiconductor material. The peaking of the electric field is caused by impurities on the surface of or within a passivation layer protecting the semiconductor surface. However, even for impurity-free passivation layers, premature reverse breakdown may occur because of spurious charge migration and concentration on the surface of the passivation layer and resulting formation of peak electric fields along the passivation layer surface. Additionally, for close spacing of guard rings or junction overlay metal, there exists a problem of arcing caused by high electric fields at the surface of the oxide passivation layer. Arcing may cause reliability problems, including metal failure, and is customarily suppressed by subsequent organic oxide passivation layers which often have harmful effects on junction breakdown voltages. Also, spurious surface charge concentrations on the surface of the first passivation layer may, depending on their location, cause a shortening or extending of the depletion layer of the subject PN junction, thereby decreasing or completely eliminating the desired effects of annular rings. Surface charge concentrations of a particular polarity may also cause inversion of the underlying semiconductor material, possibly causing the formation of parasitic FET devices which appear as "sneak" paths. The undesired inversion of semiconductor material at the oxide-semiconductor interface may be suppressed by reducing the magnitude of the electric field across the oxide, which in turn may be accomplished by providing an appropriate potential to the surface of the oxide overlying the critical region where inversion may occur. The suppression of such sneak paths by extensions of metalization over the oxide of critical areas to set the oxide surface potential to desired values may be difficult, especially in integrated circuit structures, because of limited interconnection layout freedom.

High resistivity films overlying the subject passivation layer, and electrically contacting the semiconducotr material on both sides of the semiconductor junction, have been used to neutralize charges accumulated on the surface of the passivation layer, thereby reducing peaking of surface electric fields and the resulting arcing. Such films are described in co-pending U.S. Pat. application Ser. No. 85,638 entitled "High Voltage Passivation" filed Oct. 30, 1970, by the same inventor and assigned to the same assignee. The high resistivity film must achieve a sheet resistance of approximately $10^8$–$10^{10}$ ohms per square in order to provide the charge neutralization without causing excessive leakage currents at high operating voltages. Polycrystalline silicon films have been utilized to obtain such high sheet resistances. However, it has been found that the high resistivity of the polycrystalline silicon films used in this manner experience a decrease in resistivity of several orders of magnitude after aging or subsequent processing steps. It is thought that this degradation is caused mainly by contamination of the film by moisture and other impurities from subsequent ambients or organic passivation layers. Such a reduction in resistivity causes unacceptably high leakage currents. Diffused annular guard rings surrounding and spaced from the semiconductor junction have been used to interrupt the electric field in the depletion region, thereby reducing the peak values of electric fields in the depletion region. As a result the reverse breakdown voltage is increased.

SUMMARY OF THE INVENTION

In the present invention, the stability of the leakage current for semiconductor junctions is improved for structures wherein high resistivity films are utilized to achieve uniform electric fields at the surface of the first passivation layer protecting the PN junction and associated surface depletion regions. The improvement provides protection from contaminants for the high resistivity layer by means of a contiguous overlying high integrity second passivation layer. The layer may, for example, be deposited or thermally grown silicon dioxide several hundred to several thousand angstroms in thickness, which has been found to prevent resistivity degradations caused by contamination from surrounding ambients or subsequent passivants.

The polycrystalline high resistivity film ordinarily has contacted the N type material through an opening in the first passivation layer. Electrical contact between the high resistivity film and the P region has usually been accomplished by means of a metal electrode contacting the P region and also overlying and thereby contacting an interior portion of the film.

By contacting one or more annular guard rings surrounding and spaced from the PN junction to the aforementioned high resistivity film, a voltage division effect caused by the leakage current through the high resistivity film may be used to establish the potential of the guard rings, and thereby improve the stability of the breakdown voltage.

For mesa type PN junctions, passivation is not normally used as a diffusion mask to delineate or protect the subject PN junction. In the present invention, high resistivity films contiguous with the semiconductor material and protecting the PN junction termination are provided to achieve uniform surface electric fields in the depletion region, and thereby obtain increased reverse breakdown voltage. High integrity passivation layers overlying the high resistivity film are used to achieve stable leakage currents, which shunt the PN junction through the high resistivity film.

In the present invention, the high resistivity undoped polycrystalline silicon film may also be used for suppression of parasitic FET devices, or sneak paths caused by charge accumulation on the surface of the first oxide passivation layer, which causes inversion of the underlying semiconductor material. The electric potential of the first oxide passivation layer surface is set to a desired value which suppresses the parasitic action by means of the slight conductive action of the high resistivity polycrystalline silicon film overlying that surface, and also contacting metalization known to be at the particular desired oxide surface potential under normal device operating conditions. A very thin, high integrity second passivating oxide layer is grown over the polycrystalline silicon film to protect it from resistivity degradations caused by subsequent ambients, yet sufficiently thin to allow contact of the subsequent metalization to the polycrystalline film through the second high integrity oxide passivating layer.

It is therefore an object of this invention to provide improved PN junctions having low leakage current in semiconductor devices which use high resistivity films to provide uniform electric fields at surfaces of passivation layers in order to achieve increased reverse breakdown voltage.

It is another object of this invention to improve the reliability of guard ring structures used for high voltage PN junctions by providing an electrical bias potential to the subject guard ring.

It is another object of this invention to provide a structure for stabilizing the resistivity of high resistivity films utilized to increase reverse breakdown voltage.

It is another object of this invention to provide high integrity passivation to prevent degradations of resistivity of films used for increasing PN junction breakdown voltage.

It is still another object of this invention to provide a stable passivation applicable to high voltage mesa type PN junction structures.

It is another object of this invention to provide improved electroding means for bipolar semiconductor devices for suppressing sneak paths due to parasitic FET action caused by charge accumulations on an oxide surface. It yet another object of this invention to provide improved electroding means for MOS integrated circuit devices to achieve reduced sneak paths due to parasitic MOS action, caused by charge accumulations on the oxide surface.

BRIEF DESCRIPTION OF THE DRAWINGS

Further objects and advantages of the invention will be understood from the following complete description o preferred embodiments thereof and from the drawings wherein.

DESCRIPTION OF THE INVENTION

Figure 1:
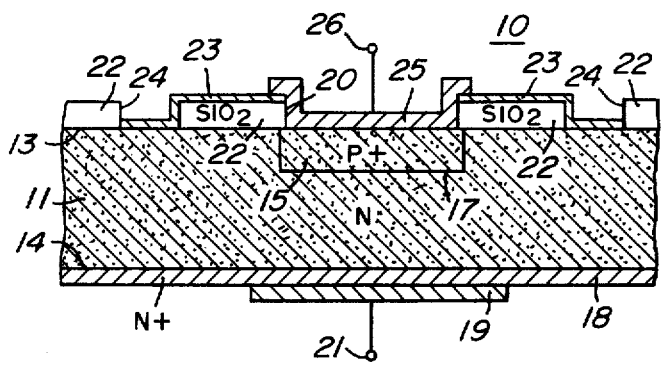
FIG. 1 is a cross-sectional view of a high voltage diode which utilizes a high resistivity film overlying the passivation to provide uniform electric fields at the surface of the passivation in accordance with the prior art.

As depicted in FIG. 1, a high voltage diode 10 representative of the prior art includes an N type wafer 11 having an upper surface 13 and a lower surface 14. A P type region 15 is diffused into wafer 11, forming a PN junction 17 which intersects upper surface 13. A heavily doped N+ region 18 contiguous with lower surface 15 facilitates electrical contact with metal electrode 19, which is contiguous with N+ region 18. Lower terminal 21 contacts metal electrode 19. A silicon dioxide first passivation layer 22 overlies and is contiguous with wafer 11 along upper surface 13, and has openings 20 and 24 exposing P+ region 15 and N type wafer 11, respectively, but covering the intersection of PN junction 17 and upper surface 13. A high resistivity film 23 is in intimate contact with and coextensive with first passivation layer 22, and also contacts N type wafer 11 through opening 24 in the first passivation layer 22. An upper metal electrode 25 contacts P region 15 through opening 20 in first passivation layer 22, and also overlays the high resistivity film 23 by an amount sufficient to ensure electrical contact thereto. The high resistivity film 23 serves to neutralize uncontrolled surface charges on the surface of and within first passivation layer 22. However, high resistivity film 23 provides a path for a shunt leakage current. Therefore it is desirable that the sheet resistance of film 23 be in the range from $10^8$–$10^{10}$ ohms per square. However, it has been found that the leakage current increases by several orders of magnitude after subsequent organic passivants are applied to the upper surface of the structure shown in FIG. 1, or if the device is exposed to usual ambients for a period of time. It is believed that this is caused by degradation of the resistivity of high resistivity film 23 because of absorption of moisture and other contaminants from subsequent passivants or ambient conditions.

Figure 2:
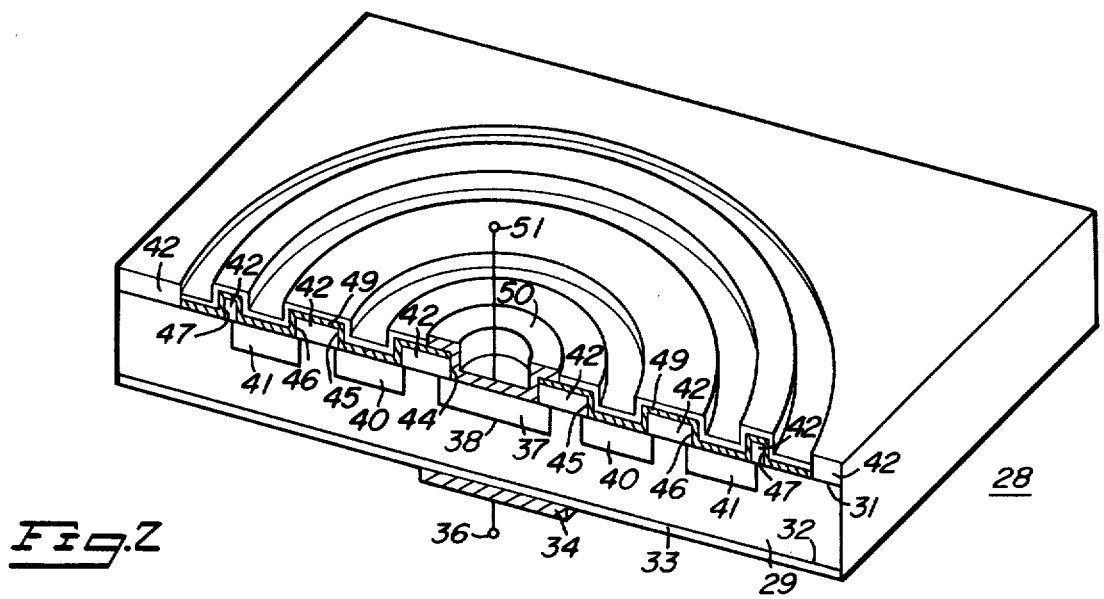
FIG. 2 is a perspective view, partly in cross-section, of a portion of a high voltage diode which utilizes a high integrity passivation film overlying a high resistivity film connected across the PN junction in accordance with the one embodiment of present invention in order to achieve a stable high resistivity film.

These difficulties are overcome by the present invention, a preferred embodiment of which is shown in FIG. 2. A high voltage diode 28 is shown, wherein an N type wafer 29 has upper surface 30 and a lower surface 32. An N+ region 33 is contiguous with lower surface 32. A lower metal electrode 34 connected to a lower terminal 36 contacts N+ region 33. A center P+ region 37 is diffused into N region 29 forming a PN junction 38, which intersects upper surface 31. A first annular P+ guard ring 40 is diffused into upper surface 31 of N type wafer 29, surrounding and spaced from P+ region 37. A second annular P+ guard ring 41 is diffused into upper surface 31 of wafer 29, surrounding and spaced from first P+ gaurd ring 40.

A first oxide passivating layer 42 is intimate contact with upper surface 31 covers all PN junctions intersecting upper surface 31, and has openings 44, 45, and 46 which expose P region 37, first guard ring 40, and second guard ring 41, respectively. First oxide passivating layer 42 also has an opening 47 which exposes N wafer 29, and surrounds and is concentric with oxide opening 46. A high resistivity film 49 composed of polycrystalline silicon deposited on the structure overlies first passivation layer 42 and also contacts guard ring 40, guard ring 41 and N type wafer 29 through oxide openings 45, 46, and 47 respectively. An upper metal electrode 50, which is connected to upper terminal 51, contacts P region 37 through oxide opening 44, and also overlays high resistivity film 49 an amount sufficient to ensure electrical contact thereto. The structure so far described is similar, except for the guard rings, to the prior art described in FIG. 1. However, in the present invention the two annular guard rings 40 and 41 have been added. They may contact high resistivity film 49. Thus, an applied voltage between terminals 36 and 51 will cause a low current to flow through high resistivity film 49 and through the contact of N type wafer 29 to high resistivity film 49 through oxide opening 47, and through the point at which high resistivity film 49 contacts upper metal electrode 50. The electric field along the surface of oxide layer 42 is uniform by virtue of the neutralizing action of the current carrying film 42 upon charge concentrations thereon. The current flowing through high resistivity film 49 will cause it to function as a voltage divider, so that concentric annular guard rings 40 and 41 may be biased at voltages intermediate between the applied voltages at terminals 36 and 51. The bias applied to the P+ guard rings 40 and 41 results in improved yield and reliability of high voltage PN junctions because random imperfections in the silicon cause variations in the reverse leakage currents of the P+ guard rings. This causes unbiased guard rings to assume varying electrical potentials, thereby defeating their function of maintaining a reduced, and also uniform, electric field in the surface depletion region of PN junction 38. By contacting guard rings 40 and 41 to high resistivity film 49, a portion of the current therethrough supplies the leakage currents of P+ guard rings 40 and 41, and establishes on them the desired potentials, thereby achieving maximum reverse breakdown voltage for PN junction 38. However, if the leakage current of guard ring 40, for example, is exceptionally large, the potential in the surface depletion region of PN junction 38 may be constrained to the potential of N type wafer 29, greatly shortening the lateral extent of the surface depletion region and thereby increasing the electric field intensity, reducing the breakdown voltage. Therefore, if high junction leakage currents are anticipated for a manufacturing process, it may be desirable to eliminate the contacts between high resistivity film 49 and the P+ guard rings 40 and 41. This would increase the yield of PN junctions having intermediate reverse breakdown voltages. The resistivity of film 49 must be sufficiently high — $10^8$ to $10^{10}$ ohms per square — that the leakage current flowing therethrough is acceptably small. The resistivity must not be subject to substantial variations due to subsequent process steps or age of the device. In the present invention, the resistivity of film 49 is stabilized by the addition of a second oxide passivation film 53, deposited or thermally grown on high resistivity film 49, and covering the exposed surface thereof. Passivating film 53 ranges in thickness from several hundred angstroms to several thousand angstroms, and is an oxide of the highest possible integrity.

Figure 3:
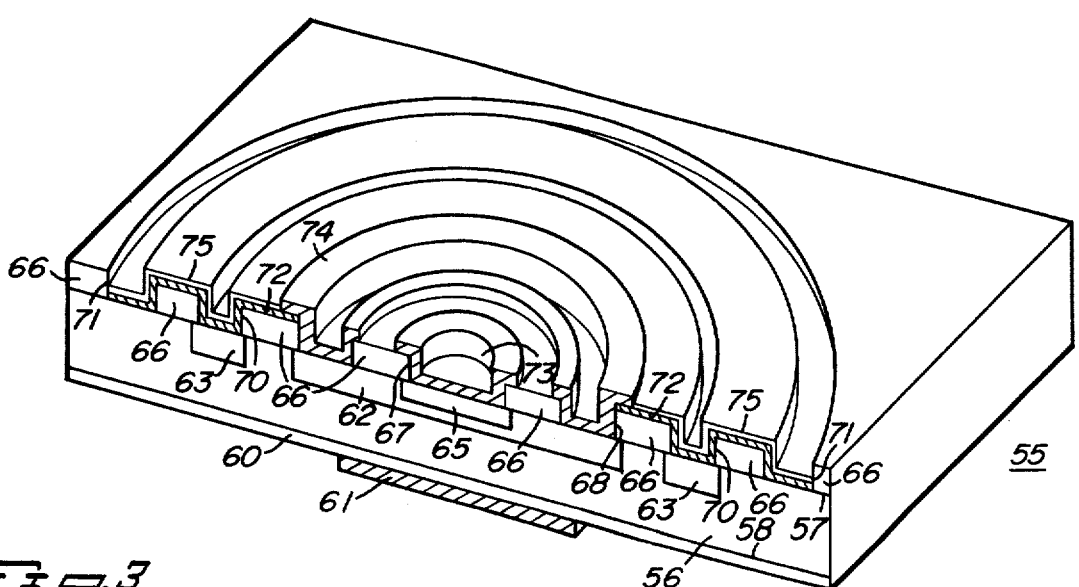
FIG. 3 is a perspective view, partly in cross-section, of a portion of a high voltage NPN transistor constructed in accordance with another embodiment of the present invention.

The subject high integrity second passivation layer may also be used to advantage in stabilizing the resistivity of high resistivity films used in high voltage transistors. A high voltage transistor 55 is shown in FIG. 3. An N type wafer 56 having a upper surface 57 and a lower surface 58, has an N+ collector contact region 60 adjacent to lower surface 58. N+ collector contact region 60 has a metal electrode 61 contacting it. A P-type base region 62 diffused into N-type wafer 56 forms a PN collector-base junction 64 with N-type wafer 56, intersecting upper surface 57. A P-type guard ring 63 is diffused into N-type wafer 56 forming a PN junction which intersects upper surface 57. An N+ emitter region 65 is diffused into base region 62, forming a PN junction which intersects upper surface 57. A first passivating layer 66 having openings 71, 70, 68 and 67, which expose N-type wafer 56, guard ring 63, base region 62, and emitter region 65, respectively, overlies upper surface 57. Metal electrodes 74 and 73 contact base region 62 and emitter region 75, respectively, through openings 68 and 67, respectively. A high resistivity film 72 overlies first passivating layer 66, contacting N-type wafer 56 through opening 71 and also contacts metal base electrode 74.

The high resistivity film 72 in this configuration provides a uniform field at the upper surface of first passivating layer 66 over the depletion spread of the collector-base junction of the high-voltage transistor 55 in FIG. 3. The concentric annular guard ring 63 interrupts the depletion spread under high voltage reverse bias conditions and reduces the average electric field in the depletion region. The high resistivity film 72 also provides a leakage path parallel to the collector base region which must be kept as low as possible, while still effectively neutralizing surface charge concentrations and biasing annular guard ring 63. In the present invention, a second high integrity passivating layer 75 prevents resistivity degrading impurities from the environment of from subsequent passivants from being absorbed by high resistivity film 72.

It will be appreciated that either the diode 28 of FIG. 2 or the transistor 55 of FIG. 3 can be adapted for use in typical integrated circuit structures.

Figure 4:
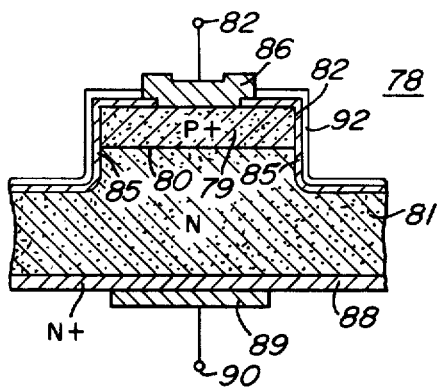
FIG. 4 is a cross-sectional view of a portion of a mesa type diode constructed in accordance with another embodiment of the present invention, wherein a high resistivity film is connected across the junction to provide uniform electric fields at the surface, and a high integrity passivation film is used to protect the high resistivity film from degradation caused by contamination.

According to the present invention, the techniques disclosed in this invention can be applied to a mesa type structure such as the one shown in FIG. 4, which shows a cross-section of a mesa diode 78. A P region 79 forms a PN junction 80 with an N-type body 81. In a typical mesa structure, the terminations of PN junction 80 are not ordinarily protected by a passivation layer. The individual diodes are isolated by etching around each structure a channel deep enough to expose the intersection of the PN junction with a wall of the channel. In FIG. 4, the PN junction 80 is shown intersecting the wall 85 of the isolation channel. In the present invention, a high resistivity film 82, typically consisting of high resistivity amorphous silicon, is deposited on the wall 85 of the etched isolation channel, thus protecting the intersection on PN junction 80 and wall 85. The high resistivity film may contact an upper metal electrode 86, which connects to an upper terminal 81. An N+ diffusion 88 is made into the lower surface of N-type body 81. A lower metal electrode 89, connected to a lower terminal 90, contacts N+ diffusion 88. A high integrity passivation oxide 92 overlies high resistivity film 82 to protect it from resistivity degradation due to absorption of impurities or contaminates from surrounding environments. It will be appreciated that this mesa structure will have higher leakage current than the previously described structures but this technique provides a mesa type device with higher reverse bias breakdown voltages than previous mesa devices. In addition to causing degradation of junction reverse breakdown voltages in semiconductor structures, it is well known that charge accumulations on oxide surfaces may cause parasitic FET action between adjacent P-type regions within a relatively lightly doped N-type region. Such parasitic action is caused by inversion of the semiconductor material due to an electric field developed across the oxide or insulator by the presence of the above-mentioned charge accumulations on oxide surfaces may cause parasitic FET action between adjacent P-type regions within a relatively lightly doped N-type region. Such parasitic action is caused by inversion of the semiconductor material due to an electric field developed across the oxide or insulator by the presence of the above-mentioned charge accumulation. The phenomena by which charge migrates over the surface of an oxide is described in, "Physics and Technology of Semiconductor Surfaces" by A.S. Gove on Pages 347-350. Also, charges can accumulate on the oxide surface by migrating from plastic packaging materials or other ambient substances. In semiconductor devices having adjacent P-type diffusions, the region in between, inverted by the charge on the surface of the oxide may act as a channel of a FET device with one of the P-type diffusions acting as a source electrode and the other acting as a drain electrode, and the distribution of charge on the overlying oxide surface acting as a gate electrode, resulting in the formation of parasitic FET. The structures of the present invention can be used to suppress this type of parasitic FET. A way of suppressing parasitic FETs caused by spurious charge accumulations on a surface of an oxide is to control the surface potential of the oxide. A means of accomplishing this, defined herein as "electroding," is to extend the interconnection metallization over the critical regions of the oxide, namely those regions which may function as a portion of the channel of a parasitic FET device adjacent a P-type diffusion acting as the source electrode of the parasitic FET in the presence of a negative accumulated oxide surface charge. The metalization so extended is chosen because its voltage during normal circuit operation is approximately equal to the desired oxide surface potential required to suppress the inversion forming the undesired parasitic channel.

This method of electroding works well for simple cases for which the layout of the metalization is simple, but layout constraints limit the extent to which it can be used when complicated metalization patterns are required, especially for integrated circuits. Accordingly to the present invention, an undoped, high resistivity layer of polycrystalline silicon is deposited on the structure as previously described. Provisions for pre-ohmic contact, that is, openings in the polycrystalline silicon and in the first passivating oxide to allow contact to the underlying silicon, are made. A high integrity, very thin second oxide passivating layer of the order of several or more angstroms in thickness is grown on the polycrystalline silicon film to prevent degradation of its resistivity due to contaminents and a patterned metalization film is applied, making contact to the various components of the integrated circuit. The polycrystalline silicon layer then sets the potential of the first passivation layer surface, thereby controlling the formation of parasitic FET devices. The resistivity of the polycrystalline silicon film must be sufficiently high that the leakage current caused between the adjacent metalizations lines is negligible, and yet must have sufficient conductivity to neutralize spurious charge accumulations of the oxide surface and thereby establish the potential of the oxide surface. Judicious extensions of particular metalization lines having desired voltages during normal circuit operating conditions may be made over critical areas to more accurately set the potential at the oxide surface. For some cases, the most expeditious manner of implementing electroding according to the present invention may be to provide high resistivity polycrystalline spaced laterally from the emitter and functioning as the collector of the transistor, with an isolated N-type island into which the emitter and collector regions are diffused functioning as the base, with a P+ isolation diffusion and a P-type substrate providing the isolation for the device. Two parasitic FET devices may be formed in this structure by the presence of negative charge accumulations on the oxide surface which may migrate from the normally negative collector electrode metal or from packaging materials. One of these devices occurs between the P-type collector and the emitter diffusions and is usually easily suppressed by extending the emitter contact metal over the emitter-base junction and thereby establishing an oxide surface potential which prevents the corresponding parasitic FET device from turning on. However, the other parasitic FET device, which is turned on by the presence of a negative charge distribution between the P-type collector ring and the surrounding P+ isolation diffusion cannot be completely protected by a junction metal overlay because of the need to bring the emitter metalization connection to points external to the lateral PNP transistor. According to the present invention, a high resistivity polycrystalline silicon layer over the first oxide surface and contacted by overlying metal provides for establishing the oxide surface potential of the critical region and also provides a means for extending the metal emitter electrode away from the device without shorting the metal collector electrode. The performance of the transistor may also be improved by extending the collector contact metal line around the P-type annular collector as much as possible without shorting the emitter electrode. Since the collector is usually negative, the resulting negative first oxide surface potential maximizes the collector depletion region and improves collection of injected minority carriers and improves the frequency response of the transistor. The base contact metal which is normally relatively negative, may be extended over the polycrystalline silicon layer, contacting it through the thin, high integrity second oxide layer, extending over the N-type region around the P-type annular collector as much as possible without shorting either the emitter or collector metal lines. This sets the underlying first oxide surface potential to a relatively positive value that prevents parasitic channels from forming between the collector and P+ isolation regions.

Another application of this electroding according to the present invention applies to MOS integrated circuits, where deleterious parasitic MOS devices are known to occur. In this case the present invention provides a heavily doped polycrystalline silicon film deposited over the entire wafer after metallization and after any subsequent passivation steps, thereby covering the entire wafer except for bonding pad openings. The film may contact the substrate on which the MOS devices are fabricated, or a power supply line. This provides an electrical ground plane over the entire chip, exclusive of bonding pad areas, thereby establishing the oxide surface potential over the entire chip to a value which tends to prevent any of the parasitic MOS devices on the chip from turning on.

While the invention has been shown in connection with certain specific examples, it will be readily apparent to those skilled in the art that various changes in form and arrangement of parts may be made to suit the requirements without departing from the spirit and scope of the present invention.

What is claimed is:

1. A high voltage semiconductor device including a first region of semiconductor material of a first conductivity type, having an upper surface, a second region of semiconductor material of a second conductivity type adjoining said first region and forming therewith a first PN junction terminating at said upper surface, first passivating means on said upper surface covering said termination of said first PN junction, a high resistivity film on said first passivating means and making electrical contact to said first region of semiconductor material and said second region of semiconductor material comprising:

high integrity second passivating means on said high resistivity film for protecting said high resistivity film from resistivity degradation;

a guard ring of semiconductor material of said second conductivity type in said first region and forming therewith a second PN junction terminating at said upper surface, said guard ring surrounding and spaced from said second region; and an opening in said first passivating means exposing said guard ring, said high resistivity film contacting said guard ring through said opening for establishing the potential of said guard ring to a value between the potential of said first region and the potential of said second region.

2. The high voltage semiconductor device as recited in claim 1 wherein said high integrity second passivating means is thermally grown polycrystalline silicon having a thickness greater than one hundred angstrom units.

* * * * *